United States Patent [19]

Gustavsson

[11] Patent Number: 5,191,625
[45] Date of Patent: Mar. 2, 1993

[54] TERMINAL FOR A FREQUENCY DIVIDED, OPTICAL COMMUNICATION SYSTEM

[75] Inventor: Mats B. Gustavsson, Stockholm, Sweden

[73] Assignee: Telefonaktiebolaget L M Ericsson, Stockholm, Sweden

[21] Appl. No.: 866,495

[22] Filed: Apr. 10, 1992

[30] Foreign Application Priority Data

Apr. 10, 1991 [SE] Sweden .............................. 9101077

[51] Int. Cl.⁵ .......................... G02B 6/12; G02F 1/00; H01S 3/19
[52] U.S. Cl. ........................................ 385/14; 385/18; 385/37; 385/47; 385/132; 359/128; 359/130; 359/333; 359/346; 372/7; 372/50; 372/99; 372/102
[58] Field of Search ...................... 385/2, 3, 11, 14, 18, 385/37, 39, 40, 44, 24, 47, 129, 130, 131, 132; 359/113, 117, 128, 134, 130, 160, 193, 333, 345, 346; 372/7, 11, 20, 50, 99, 102

[56] References Cited

U.S. PATENT DOCUMENTS

| | | | |
|---|---|---|---|
| 3,445,110 | 3/1976 | Hunsberger et al. | 385/14 |
| 4,157,860 | 6/1979 | Marcatili | 385/11 X |
| 4,273,445 | 6/1981 | Thompson et al. | 385/14 |
| 4,773,074 | 9/1988 | Hunsperger et al. | 372/50 |
| 4,790,615 | 12/1988 | Seki et al. | 385/14 |
| 4,831,631 | 5/1989 | Haeussler et al. | 372/92 |
| 4,878,728 | 11/1989 | Mannschke | 385/14 |
| 4,955,718 | 9/1990 | Michel | 385/14 X |
| 5,011,248 | 4/1991 | Taki | 385/14 X |
| 5,064,263 | 11/1991 | Stein | 385/14 |
| 5,109,444 | 4/1992 | Handa et al. | 385/14 |
| 5,119,447 | 6/1992 | Trisno | 385/3 |
| 5,134,671 | 7/1992 | Koren et al. | 385/14 |

FOREIGN PATENT DOCUMENTS

0365496 4/1990 European Pat. Off. .......... 385/41 X

OTHER PUBLICATIONS

S. Kobayashi, "Semiconductor Optical Amplifiers," *IEEE Spectrum*, pp. 26-33 (May 1984).
J. Mellis et al., "Coherent Detection of 565 Mbit/s DPSK Data Using Semiconductor Laser Amplifier as Phase Modulator" *Electronics Letters*, vol. 25, No. 10, pp. 680-682 (May 1989).
M. S. Whalen et al., "Wavelength-Tunable Single-Mode Fibre Grating Reflector", *Electronics Letters*, vol. 22, No. 24, pp. 1307-1308 (Nov. 1986).
H. Inoue et al., "Optical Amplification by Monolithicaly Integrated Distributed-Feedback Lasers", *Appl. Phys. Lett.*, vol. 51, No. 20, pp. 1577-1579 (Nov. 1987).
T. L. Koch et al., "GainAs/GainAsP Multiple-Quantum-Well Integrated Heterodyne Receiver", *Electronics Letters*, vol. 25, No. 14, pp. 1621-1623 (Nov. 1989).

(List continued on next page.)

*Primary Examiner*—Brian Healy
*Attorney, Agent, or Firm*—Burns, Doane, Swecker & Mathis

[57] ABSTRACT

An optical terminal has optical waveguides, 3-dB couplers, laser diodes, laser diodes provided with gratings, and connections on a substrate made of semiconductor material. The grating laser diodes have an external cavity which is formed by the waveguides and delimited by mirrors. Each of the laser diodes has a respective electrical connection through which the diodes can be switched between a light-absorbing mode, a light-amplifying mode, and a light-emitting mode, with the aid of electric current signals, and the diodes are also able to detect a light signal. The terminal can perform a number of functions. A light signal can be received, detected, amplified, and further transmitted. A narrow band light signal of desired wavelength can be generated within a broad wavelength area through the grating diodes in the cavity, and amplified and further transmitted. A light signal received having a plurality of wavelengths can amplify and detect a selected one of the wavelengths through the laser diodes in the cavity. Coherent reception of a light signal can be performed and a phase-modulated light signal can be transmitted.

4 Claims, 8 Drawing Sheets

OTHER PUBLICATIONS

M. S. Whalen et al., "Wavelength-Tunable Single-Mode Fibre Grating Reflector", *Electronics Letters*, vol. 22, No. 24, pp. 1307-1308 (Nov. 1986).

M. Gustavsson et al., "Traveling Wave Semiconductor Laser Amplifier Detectors", *Journal of Lightwave Technology*, vol. 8, No. 4, pp. 610-617 (IEEE, Apr. 1990).

M. Gustavsson et al., "System Performance of Semiconductor Laser Amplifier Detectors", *Electronics Letters*, vol. 25, No. 20, pp. 1375-1376 (Sep. 1989).

D. W. Smith, "Techniques for Multigigabit Coherent Optical Transmission", *Journal of Lightwave Technology*, vol. LT-5, No. 10 (IEEE, Oct. 1987).

T. L. Koch et al., "Semiconductor Photonic Integrated Circuits", *Integrated Photonics Research*, pp. 2 and 3.

Y. Suematsu et al., "Integrated Optics Approach for Advanced Semiconductor Lasers", *Proceedings of the IEEE*, vol. 75, No. 11, pp. 1472-1487.

J. E. Bowers et al., "High-Speed Zero-Bias Waveguide Photodetectors", *Electronics Letters*, vol. 22, No. 17, pp. 905-906 (Aug. 1986).

P. P. Smyth et al., "High Performance Balanced Dual Detector GaAs IC Receiver for Mbit/s Heterodyne Detection", publish. by British Telecom Research Labs.

A. A. M. Saleh et al., "Cascaded, Stagger-tuned, Broadband, Low-Ripple Optical Amplifiers", *Optics Letters*, vol. 13, No. 11, pp. 967-969 (Nov. 1988).

M. Okai et al., "Wide Range Continuous Tunable Double-Sectioned Distributed Feedback Lasers", pub. by Central Research Lab. in Tokyo, Japan, TuA7-2, pp. 122-125.

M. Gustavsson et al., "Multifunctional Semiconductor Laser Amplifiers: Optical Amplifiers, Detector, Gate Switch, and Transmitter", *Integrated Photonics Research*, 1990 Technical Digest, Series vol. 5, pp. 161-162.

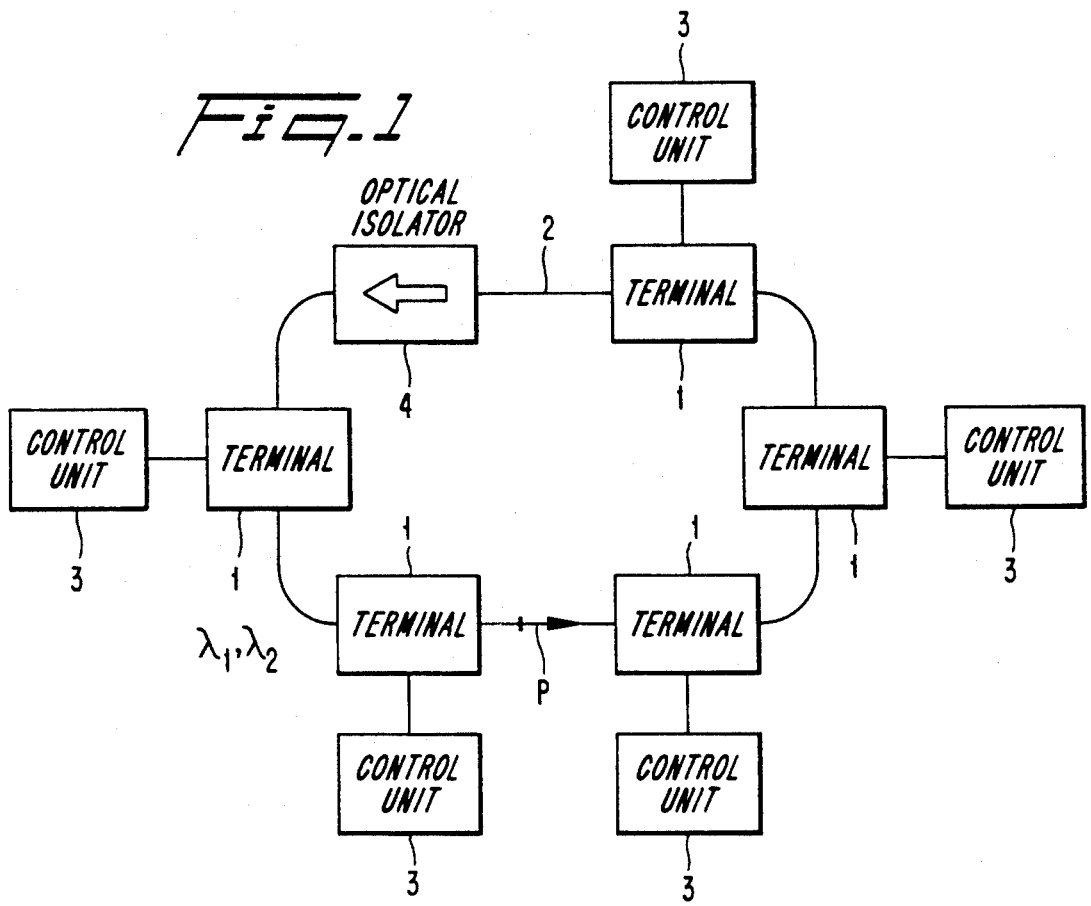
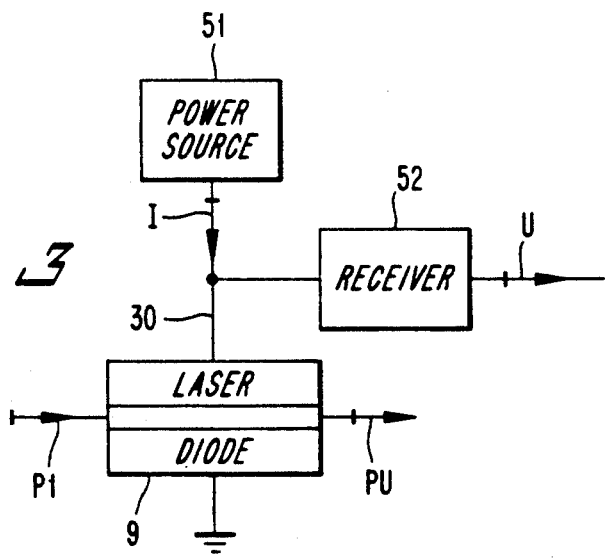

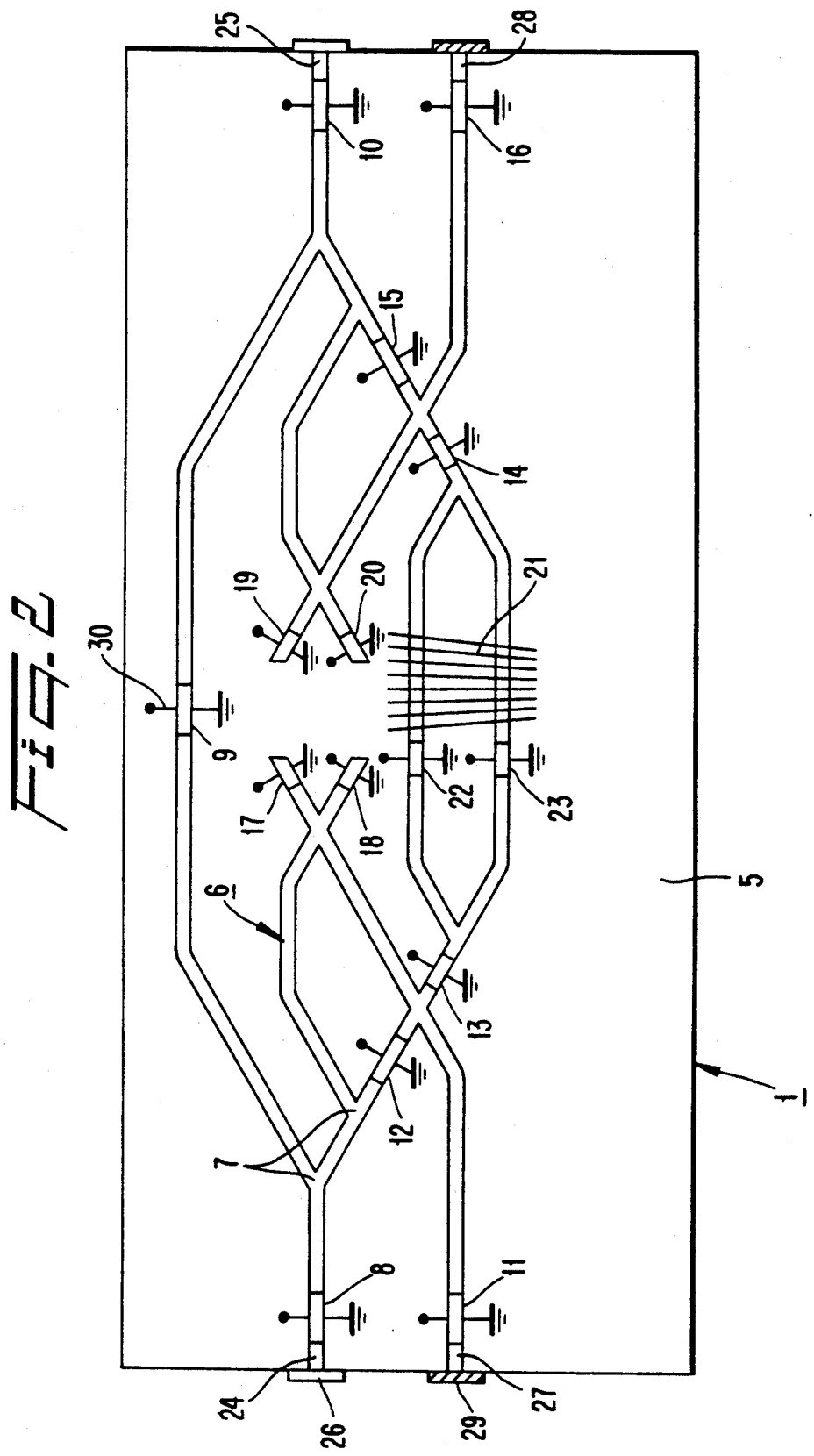

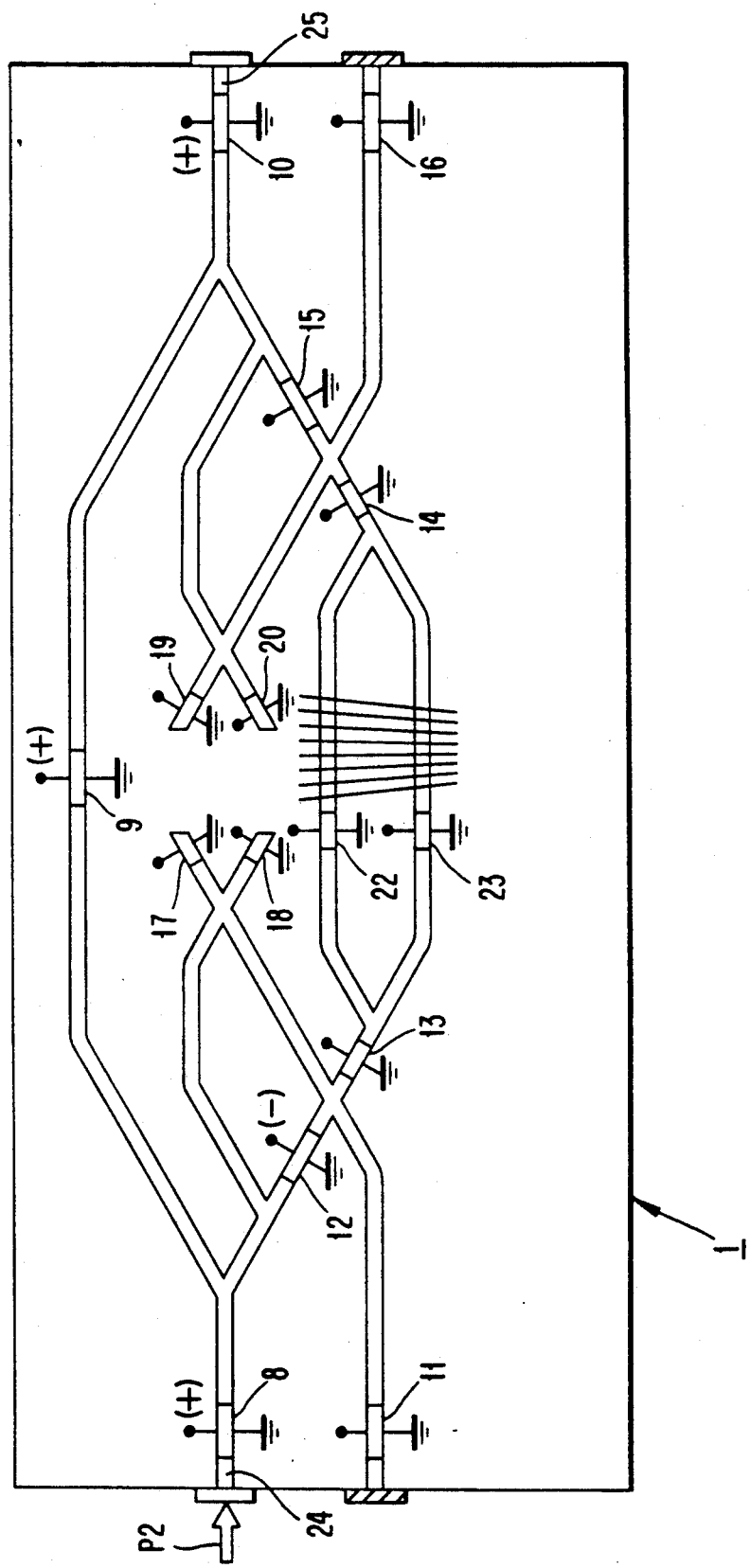

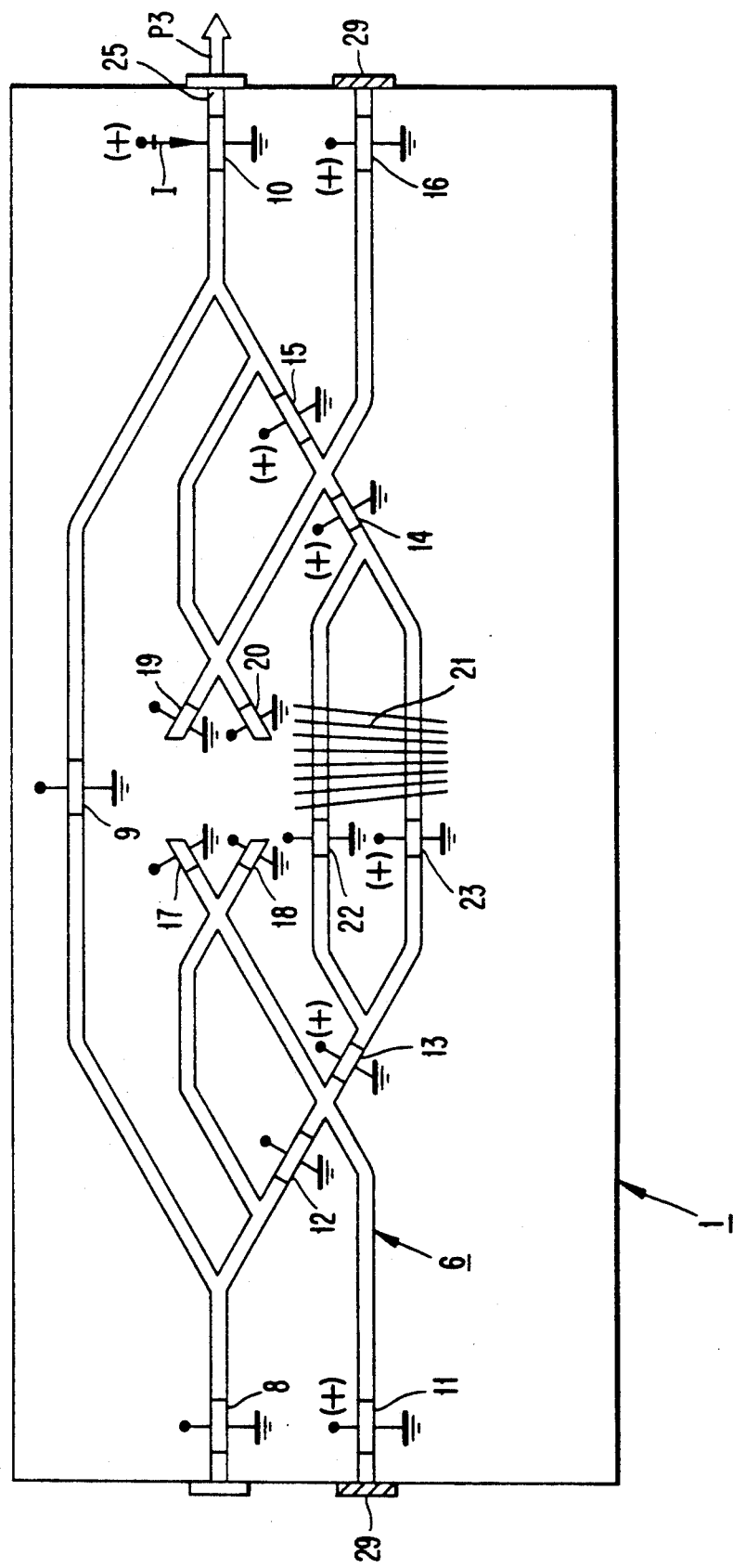

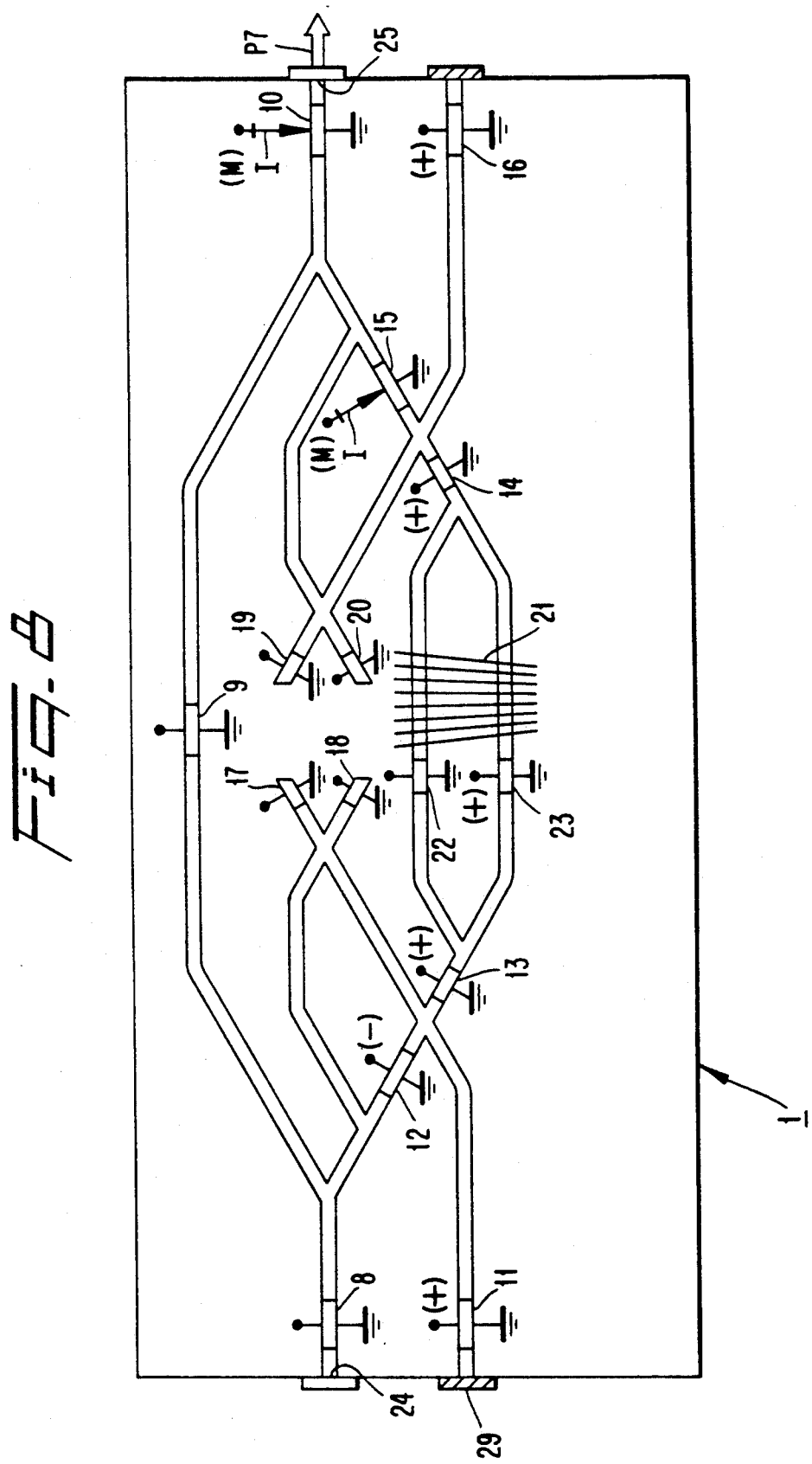

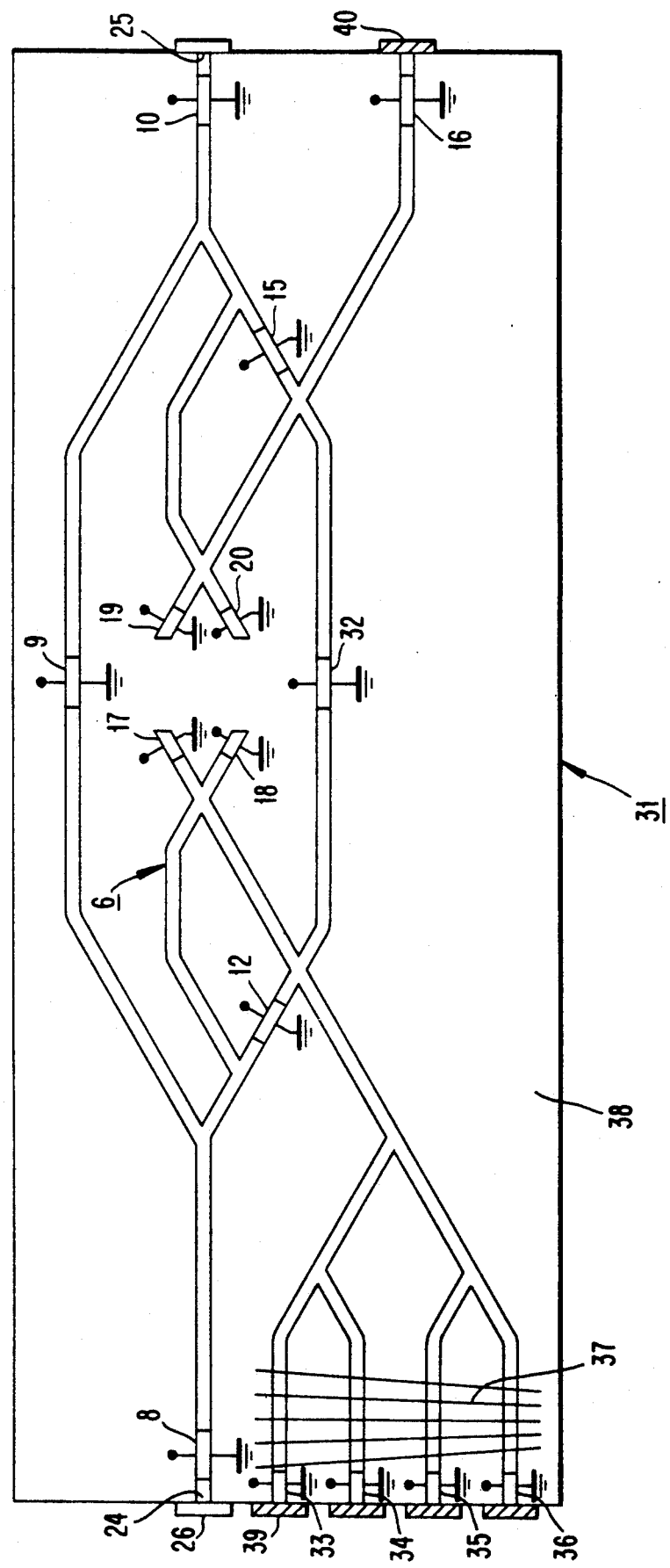

TERMINAL FOR A FREQUENCY DIVIDED, OPTICAL COMMUNICATION SYSTEM

FIELD OF THE INVENTION

The present invention relates to a terminal for a frequency-divided, optical communication system produced in integrated optics on a common semiconductor substrate having switchable laser diodes, optical waveguides with branches, mirrors and gratings. The terminal includes

- at least two connections to the communication system;
- a transmission waveguide which extends between the two connections and which is provided with at least one laser diode; and
- an extended optical cavity formed as a waveguide having at least two reflecting end surfaces.

BACKGROUND OF INVENTION

A terminal in an optical communication network comprises a plurality of known components, such as waveguide-optical directional couplers, photodetectors, waveguide branches and laser diodes. These components are described in detail in the literature. For example, an article in IEEE Spectrum, May 1984, pages 28-33, by S. Kobayashi and T. Kimura entitled "Semiconductor Optical Amplifiers" describes a semiconductor laser which is used both for detecting and for amplifying optical signals. Coherent detection of optical signals with the aid of a semiconductor laser is described in Electronics Letters, 11th May 1989 Vol. 25 No. 10, pages 680-682, J. Mellis and M. J. Creaner: "Coherent Detection of 565 Mbit/s DPSK Data Using Semiconductor Laser Amplifier as Phase Modulator". In an article in Electronics Letters 20th Nov. 1986, Vol. 22, No. 24, pages 1307-1308, by M. S. Whalen et al entitled "Wavelength-Tunable Single-Mode Fibre Grating Reflector", there is described a fan-shaped reflection grating which can be adjusted to provide mutually different wavelengths. An optical directional coupler is described in U.S. patent specification No. 4,157,860, and the U.S. Pat. No. 4,831,631 teaches a laser diode which includes an external resonance cavity. Waveguide branches, so-called passive 3-dB couplers are known, in which two incoming waveguides are joined to a common waveguide, which rebranches into two outgoing waveguides. A light wave in one of the incoming waveguides is divided into mutually equal powers in the two outgoing waveguides. Waveguides in monocrystalline semiconductor materials are well known.

In many cases, terminals in optical communication systems include a plurality of the aforementioned components, and also other types of components. These components are discrete units which are integrated to form relatively complicated terminals. Attempts have been made to simplify these terminals, by producing integrated optical units on a common substrate. An example of one such integrated unit is disclosed in an article in Appl. Phys. Lett. 51 (20), November 1987, pages 1577-1579, H. Inoue and S. Tsuji entitled "Optical amplification by monolithically integrated distributed-feedback lasers". The article describes an arrangement including DFB-lasers, an optical switch, and amplifiers. An integrated heterodyne receiver is described in an article presented in Electronics Letters 23rd Nov. 1989, Vol. 25, No. 24, pages 1621-1623, by T. L. Koch et al and entitled "GaInAs/GaInAsP Multiple Quantum-Well Integrated Heterodyne Receiver". This receiver includes a Bragg-reflector, a waveguide, a directional switch, amplifier and detectors.

One problem with integrated units of this kind is that the various components differ greatly from one another with respect to their design, and the manufacture of the integrated unit requires a large number of separate masks in separate production stages. This renders the units comparatively expensive and production yield is relatively low, in other words the number of useful units obtained is comparatively small.

The Swedish patent application No. 8803780-9 teaches a relatively simple terminal, which can be produced on one single substrate. The terminal is able to detect, amplify and transmit a light wave. One weakness of the terminal, however, is that it cannot be used in a broadband optical communication system that uses optical signals of multiple wavelengths. In a system of this kind, several wavelengths are handled simultaneously by a terminal, for instance such that one of the wavelengths is detected and the remaining wavelengths are amplified and forwarded.

SUMMARY OF THE INVENTION

The aforesaid problems associated with a terminal for a broadband optical communication system are solved in accordance with the present invention with the aid of an optical integrated circuit having a few types of components on a common semiconductor substrate. The components primary used are semiconductor laser diodes, gratings for these diodes, and passive 3-dB couplers. The components are mutually connected through waveguides and are inventively arranged such as to enable a plurality of optical signals within a broad wavelength range to be processed simultaneously. Signal processing includes signal amplification, direct and coherent detection, and transmission of a narrowband amplitude-modulated or phase-modulated light signal of desired wavelength within the whole of the broad wavelength range.

BRIEF DESCRIPTION OF THE DRAWINGS

An exemplifying embodiment of the invention will now be described in more detail with reference to the accompanying drawings, in which:

FIG. 1 illustrates schematically a ring-shaped optical communication system;

FIG. 2 illustrates an inventive terminal;

FIG. 3 is a block schematic which includes a laser diode and connected control means;

FIGS. 4-8 inclusive illustrate different cases in the operation of the terminal illustrated in FIG. 2; and FIG. 9 illustrates an alternative embodiment of the terminal.

DETAILED DESCRIPTION OF THE PREFERRED EMBODIMENTS

Figure 6:
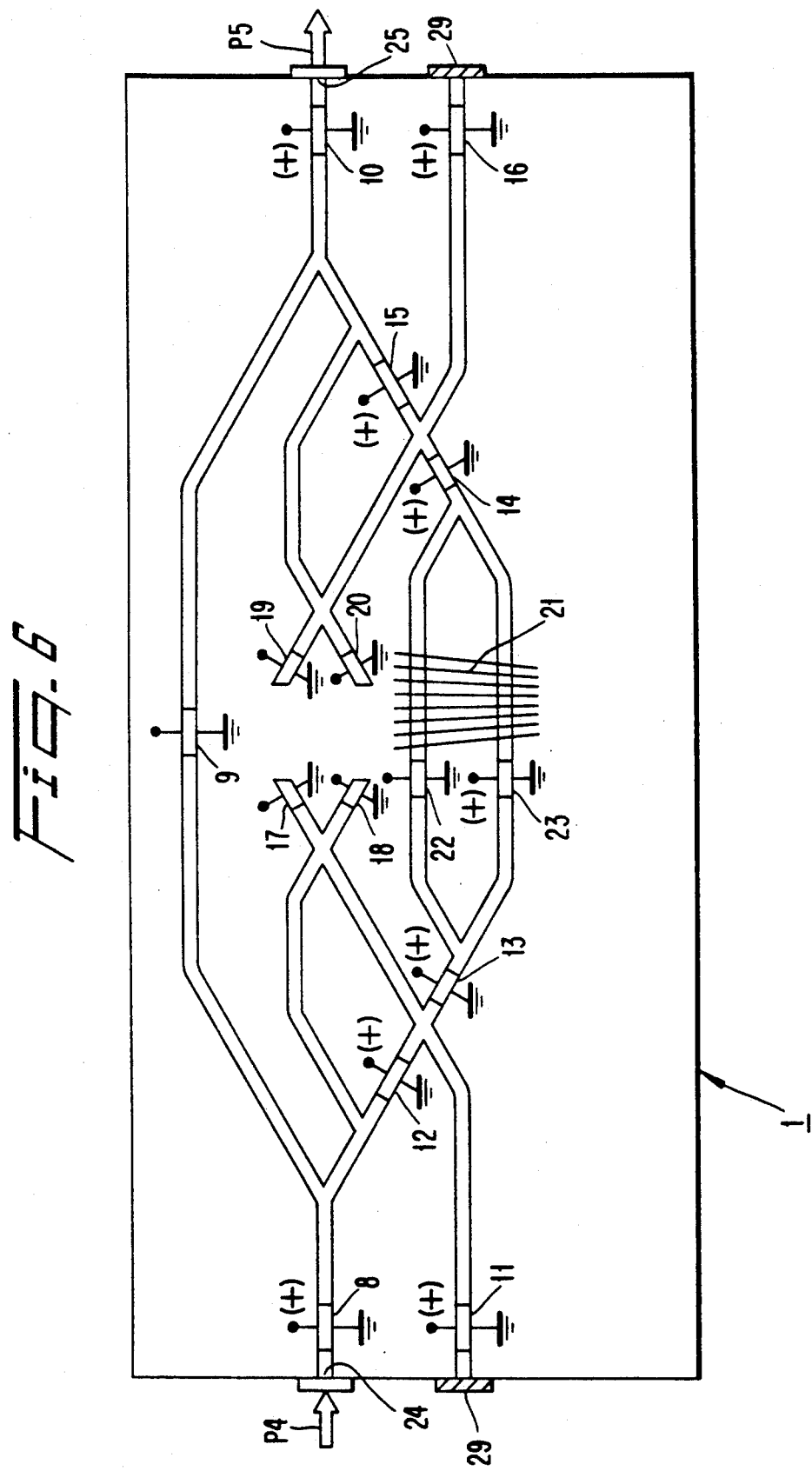

A ring-shaped optical communication system is illustrated schematically in FIG. 1. Terminals 1 are mutually connected by an optical fibre 2, and each of the terminals includes a respective control unit 3. These control units exchange electrical signals with the terminals 1, for the generation or registration of optical signals P which are transferred between the terminals 1. The communication system is frequency divided, and a plurality of optical signals with light wavelengths $\lambda_1 \ldots \lambda_j \ldots \lambda_N$ with narrow line widths are transferred on the optical fibre 2. The signals together take up a relatively broad wavelength range. According to one example, the light wavelengths lie in an region of about 1.55 μm, the wavelengths $\lambda_N$ are ten in number and each wavelength channel has a line width of $\Delta\lambda$ which corresponds to a frequency on the order of 1–10 MHz. Optical isolator 4 can be placed between the terminals 1, to prevent optical signals from being undesirably directed in the communication system.

An exemplifying embodiment of the inventive terminals 1 is illustrated in FIG. 2. A semiconductor substrate 5 supports optical waveguides 6, passive 3-dB couplers 7, laser diodes 8–20, a fan-shaped grating 21 and grating-provided, parallel-connected laser diodes 22 and 23. The waveguides 6 extend to the short sides of the substrate 5 and there form connections 24 and 25 for the optical fibres 2 in the communication system. The waveguide in which the laser diode 9 is located between the connections 24 and 25 forms a transmission waveguide for a light signal incoming to the connection 24 and delivered from the connection 25. The waveguides 6 have a further two branches which extend to the short sides of the base or substrate 5, and the waveguides have reflecting end surfaces 27 and 28 adjacent these branches.

The two connections 24 and 25 have low reflecting ability, and the end surfaces of said connections are obliquely positioned and coated with an antireflex coating 26. The two reflecting end surfaces 27 and 28 may be provided with mirrors 29, or each of said surfaces may include a respective cleaved crystal surface of the substrate 5, with a reflectance on the order of 30%. The laser diodes 8–20 and 22, 23 are travelling wave amplifiers of known construction, for example diodes according to the aforesaid reference IEEE 1984 "Semiconductor optical amplifiers". The laser diodes have electrical connections 30 which control the diodes in the manner described in more detail hereinafter with reference to FIG. 3. The fan-shaped grating 21 imparts individual grating constants to each of the diodes 22 and 23. These gratings form optical feedback elements which determine the fundamental values of the light wavelengths of the diodes. These light wavelengths can be adjusted in the regions around the fundamental values, by applying electric current to the grating parts of the laser diodes 22 and 23. This enables light signals to be produced with the narrow line width $\Delta\lambda$ and with the centre frequencies $\lambda_j$, which can be selected continuously within the aforesaid relatively broad wavelength range. The width of this range can be selected by connecting in parallel a desired number of grating-provided laser diodes with the diodes 22 and 23. The total wavelength range within which the light wavelengths can be generated at all, is determined by the semiconductor materials in the laser diodes and is of the order of about 50 nm.

As mentioned in the introduction, one and the same laser diode is able to perform several different functions. This fact will be exemplified with reference to FIG. 3. FIG. 3 includes, by way of example, the laser diode 9 whose electrical connection 30 is connected to an electric power source 51 and to a receiver 52. The power source supplies the laser diode 9 with a current I whose value can be chosen within a relatively large range. When the value I of the current is equal to zero, the diode will dampen an incoming light signal P1. In the case of a current strength of up to a first threshold value, i.e. an amplifying threshold, the diode will function as a light source. The diode becomes transparent to the incoming light signal P1 at the amplification threshold. At elevated current strengths, up to a second threshold value, a lasering threshold, the diode functions as an amplifier with an amplification factor G, to obtain an outgoing light signal $PU = G \times P1$. The diode 9 forms a laser when the current strength is further increased. When in its amplifying mode between the amplifying and lasering thresholds, the diode can also be used to detect the incoming light signal P1. A variation in the light strength of the signal causes a variation in the charge carrier concentration, which in turn results in a variation in the transition voltage of the diode 9. This voltage variation is detected by the receiver 52, which delivers a signal U corresponding to the light signal P1. The diode 9 can now be used to detect the light signal P1, also when the current $I = 0$ and the diode is reverse biased electrically. The incoming light signal P1 is herewith heavily absorbed and results in the formation of electron-hole-pairs in the diode. A voltage variation occurs across the diode, which can be detected by the receiver 52. In its reverse biased state, the diode functions as a very rapid light detector which is able to register significantly higher pulse frequencies than what the same diode is able to register in its amplifying mode.

Examples of how the inventive terminal 1 can be used will be described below with reference to FIGS. 4–8.

EXAMPLE 1

Amplifier and detector, FIG. 4

The laser diodes 8, 9 and 10 are amplifying, as indicated with a symbol (+) at the connections 30. The laser diode 12 is reverse biased, as indicated by a symbol (−), while remaining laser diodes are totally unbiassed. A light signal P2 of wave lengths $\lambda_1 - \lambda_N$ arrives at the connection 24, is amplified by the laser diodes 8, 9 and 10, and is delivered by the connection 25. Part of the light signal, which is branched upstream of the diode 12, reaches the laser diodes 17 and 18 and is there extinguished. If the light signal P2 contains only one of the wavelengths $\lambda_j$, the pulses of the light signal can be detected in the reverse biased laser diode 12 up to a high pulse frequency. It is also possible in this case to detect the light signal P2 in one of the amplifying laser diodes 8, 9 or 10.

EXAMPLE 2

Narrowband light source with broad tuning area, FIG. 5.

The laser diodes 10, 11, 13, 14, 15 and 16 are biased electrically in their forward directions and are amplifying, which is marked by the symbol (+) in FIG. 5, similar to the aforegoing. The laser diode 23 is also biased in its forward direction within its lasering range and the remaining laser diodes are totally unbiased, i.e., lack any form of bias. The laser diode 23 delivers light of the wavelength $\lambda_j$, the value of which is decided essentially by the grating 21, as beforementioned. The laser diode 23 has an external cavity, which includes the waveguides 6 with the diodes 11, 13, 14 and 16 between the mirrors 29. Light from the laser diode 23 is reflected backwards and forwards between the mirrors in this cavity and is also amplified in the diodes 11, 13, 14, and 16 besides being amplified in the diode 23. Part of the light energy is branched through a connecting waveguide with the laser diode 15, via the laser diode 10, and is delivered in the form of a narrow band light signal P3 by the connection 25. Part of the light energy in the cavity is reflected by the right hand mirror 29 to the left in FIG. 5, and is branched off to the laser diodes 19 and 20 and to the connecting waveguide having the laser diode 12. The laser diodes 19, 20 and 12 extinguish the branched part of the light energy. The light wavelength can be selected by supplying current to a selected one of the laser diodes 22 or 23. The light signal P3 can be modulated, for instance by modulating the current I to the diode 10.

EXAMPLE 3

Wavelength selective optical amplifier, FIG. 6

The laser diodes 8, 10, 12 and 15 are electrically biased to be transparent to a light signal P4 incoming to the connection 24. The diodes 11, 13, 14 and 16 in the aforesaid external cavity between the mirrors 29 are forwardly biased electrically and provide a desired degree of amplification in the cavity. The laser diode 22 is absorbing, whereas the laser diode 23 is amplifying and amplifies light of the wavelength $\lambda_j$ included in the incoming light signal P4. Only light which has the wavelength $\lambda_j$ is amplified in the cavity, because the diode 23 and its grating 21 are tuned around this wavelength. Other wavelengths, including the wavelengths of light which is emitted spontaneously from the diodes, are dampened in the cavity. An amplified light signal P5 of wavelength $\lambda_j$ is delivered from the two connections 24 and 25 of the terminal 1, but the rearwardly moving light signal from the connection 24 is extinguished in an optical isolator, not shown. Two of the light wavelengths in the light signal P4 can be amplified by also biasing the laser diode 22 to its amplifying mode. The light which is branched to the diodes 17-20 is extinguished in these diodes.

EXAMPLE 4

Wavelength selective detector, FIG. 6

In the FIG. 6 illustration, the laser diode 9 is switched to its amplifying mode, the laser diode 15 is reverse biased, and remaining diodes are unchanged from Example 3. All wavelengths in the light signal P4 are amplified in the laser diodes 8, 9 and 10 and are delivered from the connection 25. Part of the light energy in the light signal P4 is branched to the cavity between the mirrors 29. As described above with reference to Example 3, a desired wavelength of the wavelengths in P4 is amplified in the cavity. The light signal with this amplified wavelength is detected in the reverse biased laser diode 15. The detected wavelength is selected by choosing which of the laser diodes 22 and 23 is amplifying.

EXAMPLE 5

Figure 7:
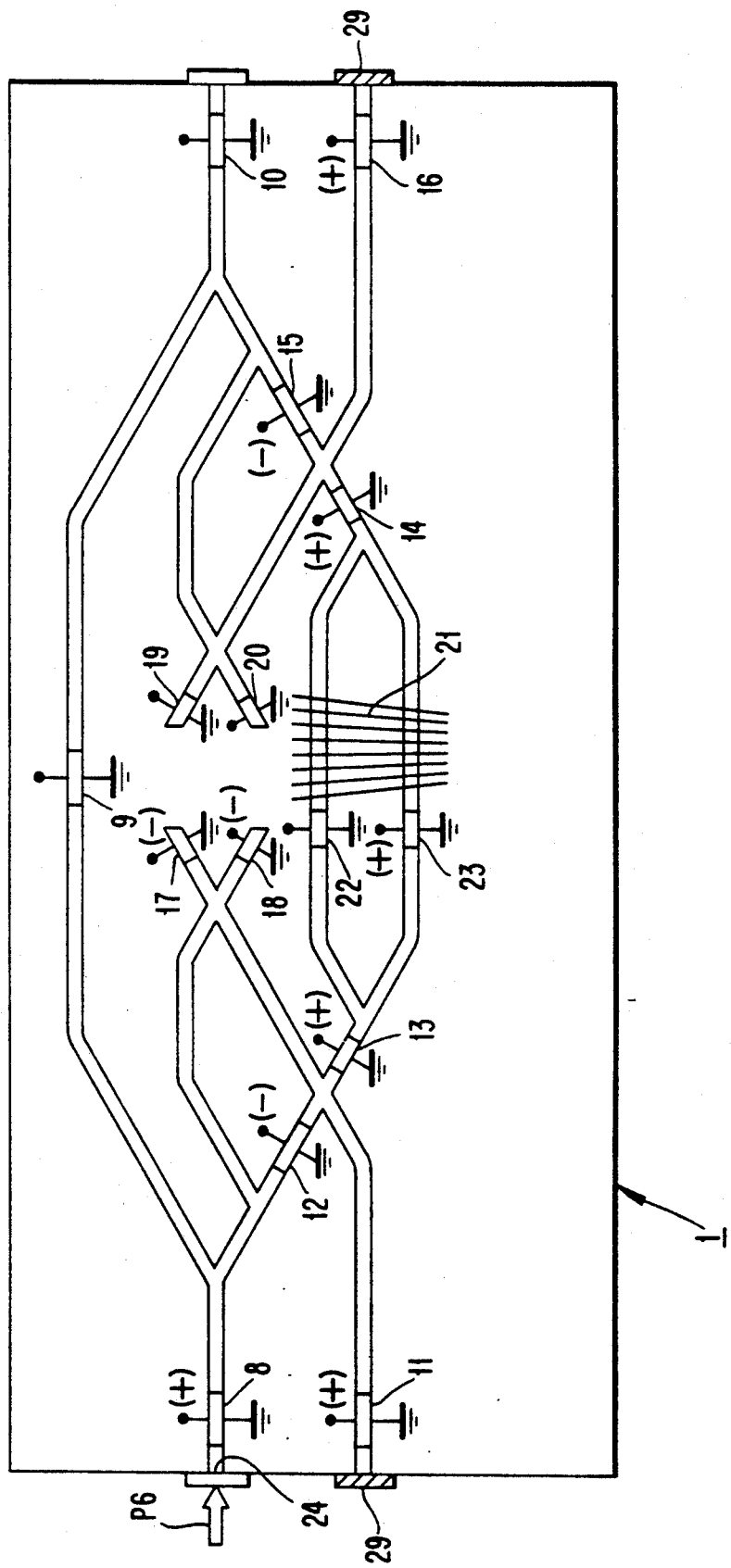

Coherent receiver, FIG. 7

The laser diodes 8, 11, 13, 14 and 16 are forwardly biased electrically and are amplifying. The diode 23 in the external cavity between the mirrors 29 is also forwardly biased and transmits light, and the diode 22 is absorbing. The two laser diodes 17 and 18 are reverse biased and function as light detectors. The diodes 12 and 15 are reverse biased to isolate the cavity effectively from the transmission line, whereas remaining laser diodes of the terminal 1 are absorbing. A coherent light signal P6 arrives at the connection 24, this signal having the wavelength $\lambda_j$ and carrying information in the form of a phase modulation. The diode 23 and its grating 21 function to generate a light signal of wavelength $\lambda_j$ in the cavity. Part of the light is branched from the cavity and absorbed in the diodes 19 and 20. Light having the well defined and constant wavelength $\lambda_j$ is branched from the cavity to the laser diodes 17 and 18 and interferes with the light signal P6. A difference signal, which gives the phase information in the light signal P6, is detected in the laser diodes 17 and 18.

EXAMPLE 6

Phase modulator FIG. 8

The diodes 11, 13, 14 and 16 in the external cavity between the mirrors 29 are amplifying. The diode 22 is absorbing and the diode 23 with its grating 21 deliver light having the wavelength $\lambda_j$. The diode 12 is reverse biased so as to isolate the cavity from the connection 24. The current I to the diodes 10 or 15 is modulated, as indicated in the Figure with a symbol (M). Remaining diodes of the terminal 1 are absorbing. A light signal having the well defined wavelength $\lambda_j$ is generated in the cavity and is branched to the connection 25. The branched light signal passes through the diodes 15 and 10 and is phase modulated in one of said two diodes to a phase modulated coherent light signal P7. In an experiment carried out with the terminal 1, there was used in this modulation process a modulation current of 10 mA, although theoretically a current strength of 1 mA should be sufficient.

The inventive terminal 1 can be used in more ways than are recited in Examples 1-6 above. For example, a light signal can be received at the connection 24, amplified and transmitted through the connection 25 at the same time as the phase modulated light signal P7 is generated. In the illustrated exemplifying embodiment, the terminal is symmetric and can be used for light signals which travel in both directions in the fibre 2 of the communication system illustrated in FIG. 1.

An alternative embodiment of the terminal will now be described briefly with reference to FIG. 9. FIG. 9 illustrates a terminal 31 on a substrate 38. Certain parts of the terminal 31 have the same design as in terminal 1. The transmission line between the connections 24 and 25 with the laser diode 9 is of the same design as terminal 1, as are also the coherent receivers with the laser diodes 17-20. The terminal 31 differs from the terminal 1 mainly in that laser diodes 33-36 are placed on one short side of the substrate 38. The diodes 33-36 have a common fan-shaped grating 37 and are connected with the remaining parts of the terminal through a tree-like branching of optical waveguides. Each of the laser diodes 33-36 has a mirror 39, which together with a mirror 40 on the other short side of the substrate define an external cavity for each of the diodes. A laser diode 32 in a waveguide which connects the two ends of the cavity forms an amplifier in said cavity. The embodiment illustrated in FIG. 9 has the advantage of being space saving, although it has the drawback, among other things, that a light wave which arrives at the cavity on the connection 24 unintentionally is able to reach the connection 25, without passing through the wavelength-filtering grating 37. This results in undesirable transmission of all wavelengths in this light wave, although the embodiment illustrated in FIG. 2 effectively prevents such undesirable transmission.

The inventive terminals have the advantage of requiring only a few number of component types, which simplifies production of the terminal. The terminal is able to perform a large number of the various functions required in a communication network, and separate functions can be achieved by switching currents. Optical signal processing in the terminal will not disturb signal transmission on the optical network to which the terminal is connected.

I claim:

1. A terminal for a frequency-divided, optical communications system on a common semiconductor substrate, the terminal comprising:

a plurality of connections to the communication system;

a transmission waveguide extending between said connections and including at least one laser diode;

an extended optical cavity formed as a waveguide having a plurality of reflecting end surfaces, said cavity having at least one laser diode provided with a wavelength grating, the wavelength of said laser diode being tunable around the grating wavelength, and having at least one connecting waveguide provided with at least one laser diode which connects the cavity with at least one of said connections; and a coherent light detector for phase-correct detection of a light signal, said light detector being connected to the cavity and to one of said connections, and said light detector having at least one laser diode for comparing the incoming light signal with a light wave of desired wavelength generated in the cavity, wherein all of said laser diodes can be switched between light-absorbing, light-amplifying and light-transmitting modes with the aid of control signals.

2. A terminal according to claim 1, wherein the cavity has at least two laser diodes provided with wavelength gratings, the wavelength gratings having different grating constants and the laser diodes being mutually connected in parallel.

3. A terminal according to claim 1, wherein the cavity is connected to said connections of the terminal, by a respective separate connecting waveguide.

4. A terminal according to claim 2, wherein the cavity is connected to said connections of the terminal, by a respective separate connecting waveguide.

* * * * *